United States Patent
Lee et al.

(10) Patent No.: US 9,443,810 B1
(45) Date of Patent: Sep. 13, 2016

(54) FLIP-CHIP EMPLOYING INTEGRATED CAVITY FILTER, AND RELATED COMPONENTS, SYSTEMS, AND METHODS

(71) Applicant: QUALCOMM Incorporated, San Diego, CA (US)

(72) Inventors: John Jong-Hoon Lee, San Diego, CA (US); Young Kyu Song, San Diego, CA (US); Uei-Ming Jow, San Diego, CA (US); Sangjo Choi, San Diego, CA (US); Xiaonan Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/853,802

(22) Filed: Sep. 14, 2015

(51) Int. Cl.
| | |
|---|---|
| *H01P 1/20* | (2006.01) |
| *H01P 7/06* | (2006.01) |
| *H01L 21/00* | (2006.01) |
| *H01L 27/15* | (2006.01) |
| *H01L 23/66* | (2006.01) |
| *H01L 49/02* | (2006.01) |
| *H01L 23/552* | (2006.01) |

(Continued)

(52) U.S. Cl.
CPC .............. *H01L 23/66* (2013.01); *H01L 23/552* (2013.01); *H01L 28/10* (2013.01); *H01L 28/40* (2013.01); *H01P 1/201* (2013.01); *H03B 5/1817* (2013.01); *H01L 2223/6666* (2013.01); *H01L 2223/6672* (2013.01); *H01L 2224/10* (2013.01); *H01P 7/06* (2013.01)

(58) Field of Classification Search
CPC ..... H03B 5/1817; H01P 1/2053; H01P 7/06; H01L 23/64–23/66
See application file for complete search history.

(56) References Cited

U.S. PATENT DOCUMENTS 6,130,483 A 10/2000 Shizuki et al.
6,297,716 B1 * 10/2001 Wood ................... H03B 5/1817
                                                   327/116

(Continued)

FOREIGN PATENT DOCUMENTS

WO       2010139366 A1    12/2010

OTHER PUBLICATIONS

Author Unknown, "Band Pass Filters 460 Series," MI-WAVE Millimeter Wave Products Inc., Date Accessed: Sep. 16, 2015, 3 pages, www.miwv.com/millimeter-wave-products/filters/.

(Continued)

*Primary Examiner* — Victor A Mandala
*Assistant Examiner* — Regan J Rundio
(74) *Attorney, Agent, or Firm* — Withrow & Terranova, PLLC

(57) ABSTRACT

A flip-chip employing an integrated cavity filter is disclosed comprising an integrated circuit (IC) chip comprising a semiconductor die and a plurality of conductive bumps. The plurality of conductive bumps is interconnected to at least one metal layer of the semiconductor die to provide a conductive "fence" that defines an interior resonator cavity for providing an integrated cavity filter in the flip-chip. The interior resonator cavity is configured to receive an input RF signal from an input transmission line through an input signal transmission aperture provided in an internal layer in the semiconductor die. The interior resonator cavity resonates the input RF signal to generate the output RF signal comprising a filtered RF signal of the input RF signal, and couples the output RF signal on an output signal transmission line in the flip-chip through an output transmission aperture provided in the aperture layer.

29 Claims, 11 Drawing Sheets

(51) Int. Cl.
*H03B 5/18* (2006.01)
*H01P 1/201* (2006.01)

(56) References Cited

U.S. PATENT DOCUMENTS

| | | | |
|---|---|---|---|
| 7,612,728 B2 | 11/2009 | Heinrich et al. | |
| 8,749,056 B2* | 6/2014 | Kehrer | H01L 23/3107 |
| | | | 257/685 |
| 8,866,291 B2 | 10/2014 | Alm | |
| 9,123,983 B1* | 9/2015 | Oran | H01P 1/205 |
| 2010/0309073 A1* | 12/2010 | Rofougaran | H01Q 1/2283 |
| | | | 343/772 |
| 2011/0175793 A1 | 7/2011 | Suzuki | |
| 2016/0126925 A1* | 5/2016 | Maxim | H01P 7/06 |
| | | | 333/185 |

OTHER PUBLICATIONS

Hsu, Cheng-Ying et al., "A 60-GHz Millimeter-Wave Bandpass Filter Using 0.18-μm CMOS Technology," IEEE Electron Device Letters, vol. 29, No. 3, Mar. 2008, pp. 246-248.

* cited by examiner

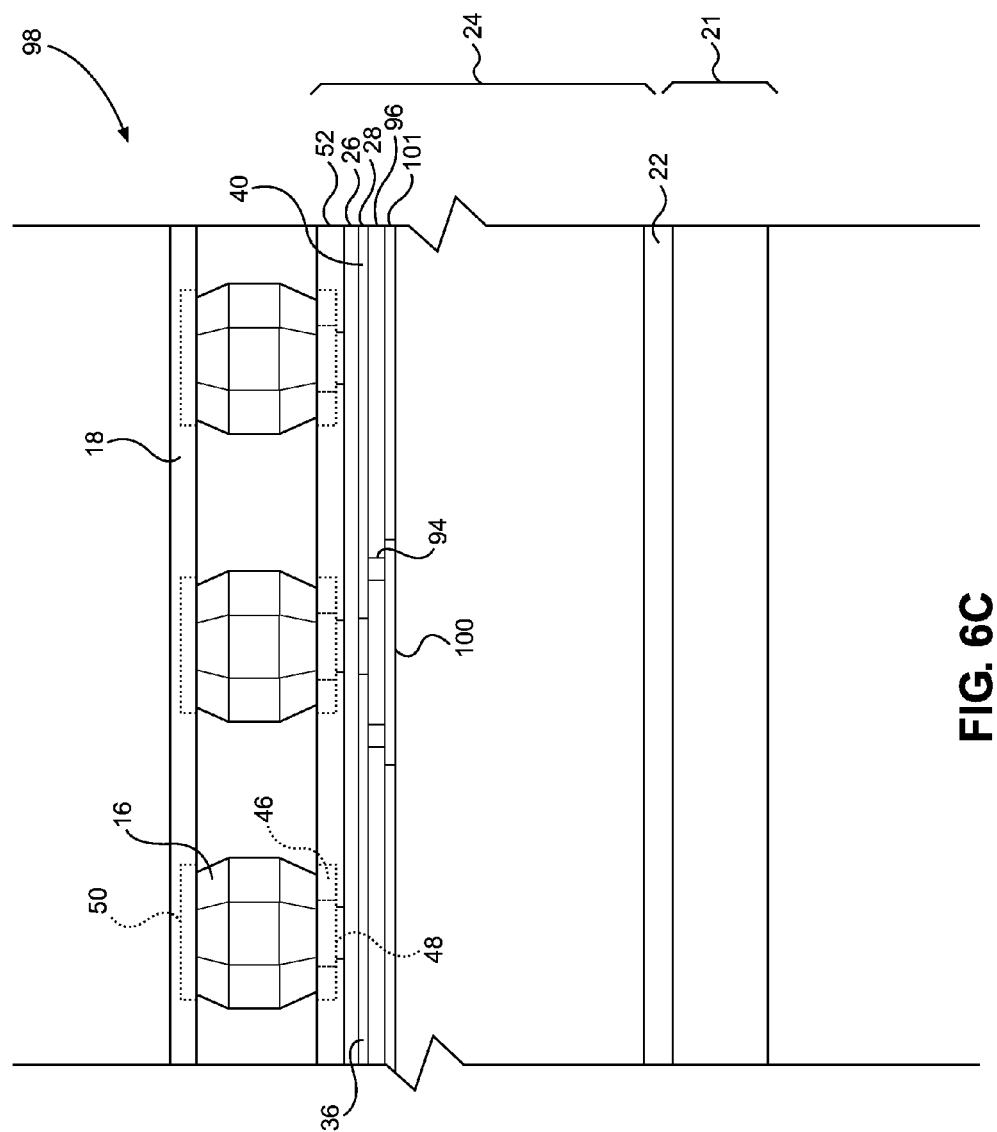

FLIP-CHIP EMPLOYING INTEGRATED CAVITY FILTER, AND RELATED COMPONENTS, SYSTEMS, AND METHODS

BACKGROUND

I. Field of the Disclosure

The technology of the disclosure relates generally to structures and methods for filtering radio frequency (RF) signals, and more specifically to cavity filters for filtering RF signals.

II. Background

Wireless computing devices have become common in contemporary society. These computing devices receive and/or transmit wireless signals, such as radiofrequency (RF) signals, and rely on microprocessors and other integrated circuits (ICs) for signal processing. In both mobile devices, like smart phones, and stationary computing devices, such as desktop computers, there is a general trend toward decreasing the size of such ICs. As device sizes decrease, the available space for individual components has also decreased. There is also a trend towards providing integrated circuits for mobile devices in a system-on-a-chip (SoC). An SoC is an integrated circuit (IC) that integrates components of a computer and other electronic systems into a single chip. The SoC may contain digital, analog, mixed-signal, and often radio-frequency functions all on a single chip substrate.

In many ICs including SoCs, RF filters are commonly used to pass and/or block specific frequencies or frequency bands in an RF signal or signals. For example, a signal of interest may be contained in a sixty (60) GigaHertz (GHz) band, but a device antenna may receive frequencies across a significantly larger portion of the RF spectrum. An appropriately configured RF filter can pass the band containing the signal of interest while effectively rejecting or blocking other signals and noise contained in frequencies above and below the desired band. It is generally desirable that an RF filter pass as much of the signal in the desired pass frequency band as possible while also blocking as much of the outside spectrum as possible.

Different types of RF filters have varying filtering quality levels, referred to as a 'Q' factor (Q), which is inversely proportional to the fractional bandwidth. While it is generally desired to employ RF filters in circuits that have the highest 'Q' factor, different types of RF filters also have different drawbacks, which may affect the type of RF filter employed. For example, conventional waveguide-type filters have high-Q factor, but are relatively large in size, and therefore unsuitable for many ICs that require smaller component sizes. On the other hand, conventional microstrip-based filters are compact and easily integrated into silicon layers of a semiconductor component, but microstrip-based filters have relatively low-Q factor with relatively high signal loss. Microstrip-based filters may also be relatively difficult to isolate from nearby components, thus resulting in undesired coupling and interference with those components.

Another type of RF filter with a high-Q factor is a cavity filter. A cavity filter employs a resonator cavity that is tuned to the desired frequencies or frequency bands and able to pass those bands with low insertion loss and with high isolation from nearby components. However, if the cavity filter is desired to be employed in a circuit in a small package or application, such as a mobile application, there must be room to provide a resonator cavity. Further, the dimensions for the resonator cavity are tied to the desired frequency bands and therefore present additional design challenges for mobile applications and other applications where space and component sizes are limited.

SUMMARY OF THE DISCLOSURE

Aspects disclosed in the detailed description include a flip-chip employing an integrated cavity filter. Related components, systems, and methods are also disclosed. In one aspect, a flip-chip is provided that includes an integrated circuit (IC) chip comprising a semiconductor die and a plurality of conductive bumps. The semiconductor die comprises at least one semiconductor layer and a plurality of metal layers for providing interconnections to the at least one semiconductor layer. The plurality of conductive bumps is interconnected to at least one metal layer. The plurality of conductive bumps provides a conductive "fence" that defines an interior resonator cavity for providing an integrated cavity filter in the flip-chip. This arrangement of package design allows the flip-chip be designed to include an integrated high-Q factor (Q) cavity filter with little or no increase in component size over a conventional flip-chip design. In this regard, interior resonator cavity is configured to receive an input RF signal from an input transmission line through an input signal transmission aperture provided in an internal layer in the flip-chip. The interior resonator cavity resonates the input RF signal to generate the output RF signal comprising a filtered RF signal of the input RF signal, and couples the output RF signal on an output signal transmission line in the flip-chip through an output transmission aperture provided in the aperture layer. The filtered RF signal can then be coupled through the metal layers to the internal circuitry in semiconductor layer(s) of the flip-chip for processing. The flip-chip components can be customized in the design phase so that the conductive bumps define the internal resonator cavity having dimensions corresponding to a cavity filter designed to filter a RF signal in a predetermined frequency band.

In this regard, in one aspect, an integrated circuit (IC) chip is disclosed. The flip-chip IC comprises a semiconductor die. The semiconductor die comprises at least one semiconductor layer. The semiconductor layer further comprises a plurality of metal layers for providing interconnections to the at least one semiconductor layer. The semiconductor die further comprises an aperture layer comprising an input signal transmission aperture configured to pass an input radio frequency (RF) signal therethrough, and an output signal transmission aperture configured to pass an output RF signal therethrough. The semiconductor die further comprises at least one back end-of-line interconnect layer disposed between the at least one semiconductor layer and the aperture layer. The at least one back end-of-line interconnect layer comprises an input transmission line configured to transmit the input RF signal through the input signal transmission aperture. The at least one back end-of-line interconnect layer further comprises an output transmission line configured to receive the output RF signal through the output signal transmission aperture. The flip-chip IC further comprises a plurality of conductive bumps interconnected to at least one metal layer, the plurality of conductive bumps and the aperture layer defining an interior resonator cavity. The interior resonator cavity is configured to receive the input RF signal from the input transmission line through the input signal transmission aperture, resonate the input RF signal to generate the output RF signal comprising a filtered RF signal of the input RF signal, and couple the output RF signal on the output transmission line through the output signal transmission aperture.

In another aspect, an integrated circuit (IC) chip is disclosed. The flip-chip IC comprises a means for providing at least one semiconductor layer in a semiconductor die. The flip-chip IC further comprises a means for providing a plurality of metal layers for providing interconnections to the means for providing a semiconductor layer. The flip-chip IC further comprises a means for providing an aperture layer comprising an input signal transmission aperture configured to pass an input radio-frequency (RF) signal therethrough, and an output signal transmission aperture configured to pass an output RF signal therethrough. The flip-chip IC further comprises a means for providing at least one back end-of-line interconnect layer disposed between the at least one semiconductor layer and the aperture layer, the at least one back end-of-line interconnect layer. The at least one back end-of-line interconnect layer comprises an input transmission line configured to transmit the input RF signal through the input signal transmission aperture. The at least one back end-of-line interconnect layer further comprises an output transmission line configured to receive the output RF signal through the output signal transmission aperture. The flip-chip IC further comprises a means for providing a plurality of conductive connections interconnected to at least one metal layer. The flip-chip IC further comprises a means for providing an interior resonator cavity from the means for providing the plurality of conductive connections and the means for providing an aperture layer, for providing the interior resonator cavity for receiving the input RF signal from the input transmission line through the input signal transmission aperture, resonating the input RF signal to generate the output RF signal comprising a filtered RF signal of the input RF signal, and coupling the output RF signal on the output transmission line through the output signal transmission aperture.

In another aspect, a method of forming a flip-chip IC is disclosed. The method comprises providing at least one semiconductor layer. The method further comprises disposing a plurality of metal layers above the at least one semiconductor layer for providing interconnections to the at least one semiconductor layer. The method further comprises disposing at least one back end-of-line interconnect layer above the plurality of metal layers. The at least one back end-of-line interconnect layer comprises an input transmission line configured to transmit an input RF signal. The at least one back end-of-line interconnect layer further comprises an output transmission line configured to receive an output RF signal. The method further comprises disposing an aperture layer above the at least one back end-of-line interconnect layer, the aperture layer comprising an input signal transmission aperture configured to pass the input RF signal therethrough, and an output signal transmission aperture configured to pass the output RF signal therethrough. The method further comprises disposing a plurality of conductive bumps above the aperture layer, the plurality of conductive bumps interconnected to at least one metal layer, the plurality of conductive bumps and the aperture layer defining an interior resonator cavity. The interior resonator cavity is configured to receive the input RF signal from the input transmission line through the input signal transmission aperture, resonate the input RF signal to generate the output RF signal comprising a filtered RF signal of the input RF signal, and couple the output RF signal on the output transmission line through the output signal transmission aperture.

In another aspect, a flip-chip system having an integrated cavity filter is disclosed. The flip-chip system comprises a flip-chip IC. The flip-chip IC comprises a semiconductor die. The semiconductor die comprises at least one semiconductor layer. The semiconductor die further comprises a plurality of metal layers for providing interconnections to the at least one semiconductor layer. The semiconductor die further comprises an aperture layer comprising an input signal transmission aperture configured to pass an input RF signal therethrough, and an output signal transmission aperture configured to pass an output RF signal therethrough. The semiconductor die further comprises at least one back end-of-line interconnect layer disposed between the at least one semiconductor layer and the aperture layer. The at least one back end-of-line interconnect layer comprises an input transmission line configured to transmit the input RF signal through the input signal transmission aperture. The at least one back end-of-line interconnect layer further comprises an output transmission line configured to receive the output RF signal through the output signal transmission aperture. The flip-chip system further comprises a plurality of conductive bumps interconnected to at least one metal layer. The flip-chip system further comprises an external circuit interconnected to the plurality of conductive bumps. The flip-chip system further comprises an external circuit interconnected to the plurality of conductive bumps, the plurality of conductive bumps, the aperture layer, and at least a portion of the external circuit defining an interior resonator cavity. The interior resonator cavity is configured to receive the input RF signal from the input transmission line through the input signal transmission aperture, resonate the input RF signal to generate the output RF signal comprising a filtered RF signal of the input RF signal, and couple the output RF signal on the output transmission line through the output signal transmission aperture

BRIEF DESCRIPTION OF THE FIGURES

FIG. 6C illustrates a partial side cross-sectional view of the IC flip-chip of FIG. 6A having the integrated cavity filter with the capacitance blocker of FIG. 6A;

DETAILED DESCRIPTION

Figure 1A:
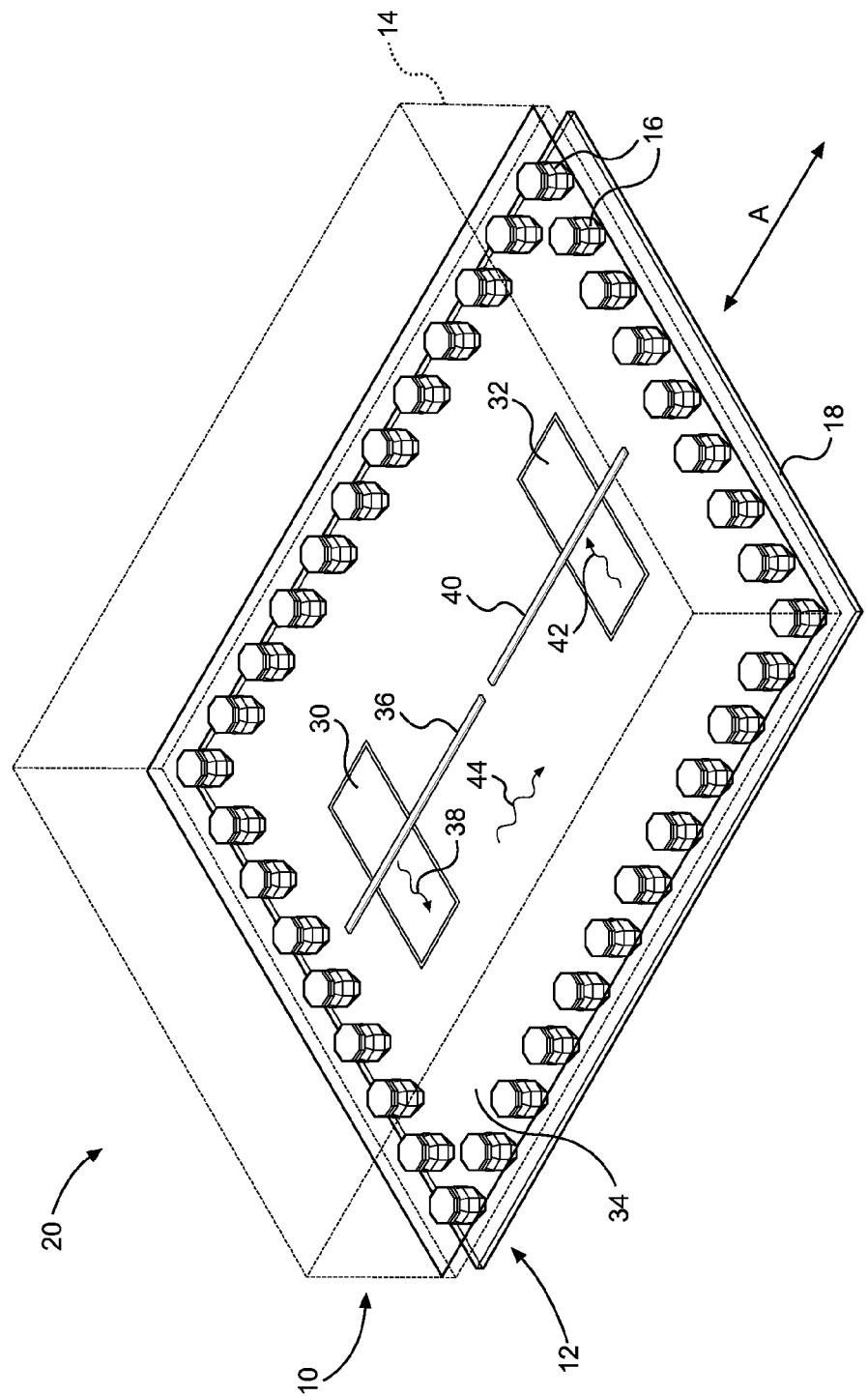
FIG. 1A illustrates a perspective view of an exemplary flip-chip integrated circuit (IC) having an integrated cavity filter provided by a plurality of conductive bumps of the flip-chip forming a cavity between opposing surfaces of a silicon die and a semiconductor package.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a flip-chip employing an integrated cavity filter. Related components, systems, and methods are also disclosed. In one aspect, a flip-chip is provided that includes an integrated circuit (IC) chip comprising a semiconductor die and a plurality of conductive bumps. The semiconductor die comprises at least one semiconductor layer and a plurality of metal layers for providing interconnections to the at least one semiconductor layer. The plurality of conductive bumps is interconnected to at least one metal layer. The plurality of conductive bumps provides a conductive "fence" that defines an interior resonator cavity for providing an integrated cavity filter in the flip-chip. This arrangement of package design allows the flip-chip be designed to include an integrated high-Q factor (Q) cavity filter with little or no increase in component size over a conventional flip-chip design. In this regard, interior resonator cavity is configured to receive an input RF signal from an input transmission line through an input signal transmission aperture provided in an internal layer in the flip-chip. The interior resonator cavity resonates the input RF signal to generate the output RF signal comprising a filtered RF signal of the input RF signal, and couples the output RF signal on an output signal transmission line in the flip-chip through an output transmission aperture provided in the aperture layer. The filtered RF signal can then be coupled through the metal layers to the internal circuitry in semiconductor layer(s) of the flip-chip for processing. The flip-chip components can be customized in the design phase so that the conductive bumps define the internal resonator cavity having dimensions corresponding to a cavity filter designed to filter a RF signal in a predetermined frequency band.

Figure 1B:
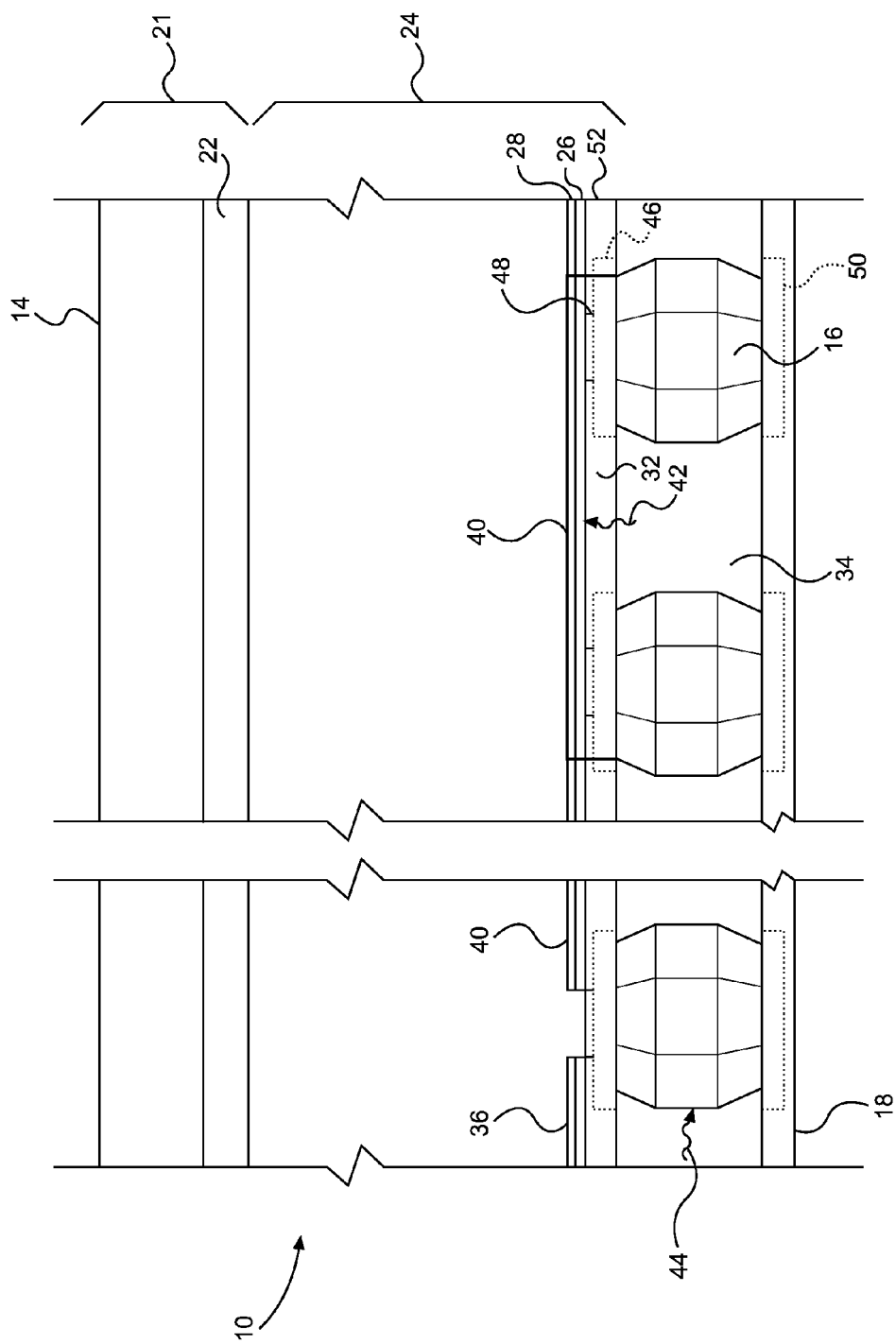
FIG. 1B illustrates a side cross-sectional view of a portion of the flip-chip IC having the integrated cavity filter in FIG. 1A, and further illustrating an exemplary location of the transmission lines and apertures within the layers of the semiconductor die.
Figure 1C:
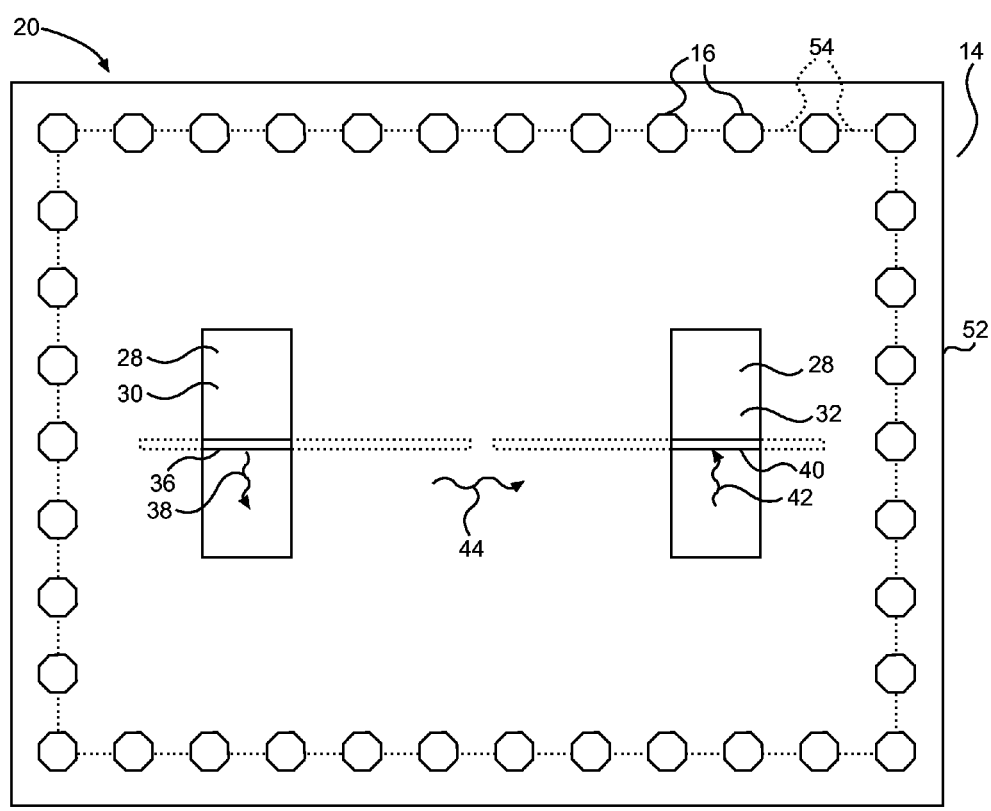
FIG. 1C illustrates a top cross-sectional view of the flip-chip IC of FIG. 1A prior to mounting the flip-chip IC on an external circuit, illustrating input and output transmission lines and respective apertures for allowing the transmission lines to filter an RF signal through the resonator cavity.

In this regard, FIGS. 1A-1C illustrate a flip-chip integrated circuit (IC) 10 having an integrated cavity filter 12 according to one aspect of the disclosure. The flip-chip IC 10 comprises a semiconductor die 14 and a plurality of conductive bumps 16 interconnecting the flip-chip IC 10 to an external circuit 18. The plurality of conductive bumps 16 forms a flip-chip assembly 20. As used herein, the term "flip-chip" refers to a flip-chip IC employing a controller collapse chip connection (C4), a well-known technique for interconnecting semiconductors to external circuitry. In a flip-chip arrangement, a semiconductor package includes a plurality of metal pads or contacts, with a conductive bump, which is typically a solder bump or solder ball deposited on each pad. The package is then "flipped" so that the conductive bumps are face down, and the package is aligned with respect to an external circuit 18 having complementary pads or contacts corresponding to each of the solder bumps. The solder bumps are then reflowed to complete the interconnect.

With continuing reference to FIG. 1A, the semiconductor die 14 comprises a silicon layer 21 having a semiconductor layer 22 and a plurality of metal interconnect layers 24 (see FIG. 1B) for providing interconnections to the semiconductor layer 22 and the conductive bumps 16. The semiconductor die 14 also comprises an aperture layer 26 and a back end-of-line interconnect layer 28, which is disposed between the semiconductor layer 22 and the aperture layer 26.

As discussed in more detail below, the plurality of conductive bumps 16 in the flip-chip IC 10 in FIG. 1 are used to provide a conductive "fence" that provides an integrated interior resonator cavity 34 for an integrated cavity filter 12. This allows the integrated cavity filter 12 to be provided in the flip-chip IC 10 with little or no increase in component size over a conventional flip-chip design, and without the need for a separate component to provide high-Q filtering. However, to provide the integrated cavity filter 12 employing the interior resonator cavity 34, a method of directing an input RF signal into the interior resonator cavity 34 to be filtered into a filtered output RF signal to be coupled to a metal layer(s) to be interconnected to a semiconductor layer in the flip-chip IC for signal processing is provided.

In this regard, the flip-chip IC 10 in FIG. 1A includes an aperture layer 26. The aperture layer 26 comprises an input signal transmission aperture 30 and an output signal transmission aperture 32. The aperture layer 26 and the conductive bumps 16 together define an interior resonator cavity 34. By interconnecting the conductive bumps 16 with the external circuit 18, the interior resonator cavity 34 is enclosed.

To use the interior resonator cavity 34 provided in the flip-chip IC to provide integrated cavity filter 12 in this example, an input transmission line 36 and an output transmission line 40 are provided in the back end-of-line interconnect layer 28. The input transmission line 36 is configured to transmit an input RF signal 38 into the interior resonator cavity 34 through the input signal transmission aperture 30. The output transmission line 40 is configured to receive an output RF signal 42 through the output signal transmission aperture 32. The interior resonator cavity 34 is configured to receive the input RF signal 38 from the input transmission line 36 through the input signal transmission aperture 30, resonate the input RF signal 38 to generate the output RF signal 42 comprising a filtered RF signal 44 of the input RF signal 38, and couple the output RF signal 42 on the output transmission line 40 through the output signal transmission aperture 32. By customizing the dimensions of the interior resonator cavity 34 in the design phase, the interior resonator cavity 34 can be tuned to resonate at a predetermined center frequency, thereby allowing the interior resonator cavity 34 to function as the integrated cavity filter 12 for the predetermined frequency band. In this manner, a package design employing a flip-chip technique can be designed to also include a high-Q cavity filter with little or no increase in component size over a conventional flip-chip design.

Existing flip-chip techniques can be easily adapted to include an integrated cavity filter, because these conventional techniques typically results in a gap between opposing metal layers of the semiconductor package and the external circuit. By arranging the conductive bumps, such as the conductive bumps 16 of FIGS. 1A-1C, sufficiently close to each other to enclose a portion of the gap, the conductive bumps 16 and opposing metal layers will act as a faraday cage around the enclosed portion, e.g., the interior resonator cavity 34 of FIGS. 1A-1C. Within the interior space defined by the enclosed portion, external electromagnetic (EM) radiation, including external RF signals, are blocked from entering. In addition, any RF signals inside the interior cavity are confined therein, with the interior cavity functioning as a resonator cavity with respect to the RF signals. Thus, by designing the dimensions of the cavity to define a desired resonant frequency, the cavity can be used as a cavity filter. This allows any package design employing a flip-chip technique to also include a high-Q cavity filter with little or no increase in component size.

In this regard, FIG. 1B illustrates a side cross-sectional view of two portions of the flip-chip having the integrated cavity filter 12 of FIG. 1A, taken along the vertical plane containing axis A. In particular, the left portion of FIG. 1B illustrates the center of the flip-chip IC 10, including the input transmission line 36 and the output transmission line 40. The right portion of FIG. 1B illustrates the output transmission line 40 and the output signal transmission aperture 32. As discussed above, the metal interconnect layers 24 include the aperture layer 26 and the back end-of-line interconnect layer 28, and the input transmission line 36 and output transmission line 40 may be interconnected with the metal interconnect layers 24 to interconnect with the semiconductor layer 22 and/or one or more conductive bumps 16. In this aspect, the aperture layer 26 and the back end-of-line interconnect layer 28 are adjacent to each other such that a portion of the input transmission line 36 is adjacent to the input signal transmission aperture 30 (not shown) and the output transmission line 40 is adjacent to the output signal transmission aperture 32. In this aspect as well, top layers 46 are disposed between the aperture layer 26 and the conductive bumps 16. The top layers 46 also include conductive contacts 48 and metal interconnects 50, which interconnect with the aperture layer 26 and other metal interconnect layers 24.

In this aspect, the aperture layer 26 and top layers 46 may be considered to be a single layer for the purposes of defining the interior resonator cavity 34. In this regard, the aperture layer 26, the back end-of-line interconnect layer 28, and the top layers 46 may be considered to be included among the metal interconnect layers 24. In this aspect, the input signal transmission aperture 30 and output signal transmission aperture 32 extend through the top layers 46 as well as the aperture layer 26. In this manner, the input transmission line 36 and output transmission line 40 are able to transmit and receive signals, such as input RF signal 38 and output RF signal 42, into and out of the interior resonator cavity 34. In another aspect, the top layers 46 may be instead formed from a non-metal material, such as a material that is transparent to radio frequencies, such that the dimensions of the interior resonator cavity 34 are defined by the aperture layer 26 rather than the combination of the aperture layer 26 and the top layers 46. In both aspects, the interior resonator cavity 34 is defined by a metal layer defining at least one dimension of the interior resonator cavity 34, and by the electromagnetic fence 54 formed by the conductive bumps 16. To enclose the interior resonator cavity 34, the conductive bumps 16 interconnect to the external circuit 18.

In this regard, as shown in FIG. 1B, the conductive bumps 16, such as solder balls, for example, interconnect the conductive contacts 48 of the flip-chip IC 10 with conductive pads 52 formed as part of the external circuit 18. In this aspect, the external circuit 18 is a printed circuit board (PCB), but it should be understood that other types of external circuits may be used. Here, the external circuit 18 defines the opposite boundary of interior resonator cavity 34.

As shown in FIG. 1B, gaps exist between the individual conductive bumps 16 at the horizontal boundaries of the interior resonator cavity 34. However, the conductive bumps 16 are arranged such that the conductive bumps 16, the external circuit 18, and the aperture layer 26 (or a combination of the aperture layer 26 and the top layers 46) form a faraday cage around the interior resonator cavity 34. In this regard, FIG. 1C illustrates a top view of the flip-chip IC 10 of FIG. 1A prior to mounting the flip-chip IC 10 on the external circuit 18. Here, the conductive bumps 16 are arranged such that the conductive bumps 16 form an electromagnetic "fence" 54 around the interior resonator cavity 34. In this manner, the electromagnetic fence 54 keeps out unwanted electromagnetic radiation that may interfere with the input RF signal 38, the output RF signal 42, or the filtered RF signal 44, and also forms the interior resonator cavity 34 that is effectively closed with respect to the RF frequencies of the input RF signal 38, the output RF signal 42, and the filtered RF signal 44. As discussed above, the interior resonator cavity 34 is effectively closed with respect to these RF signals 38, 42, 44, when the input RF signal 38 is introduced into the interior resonator cavity 34 through the input signal transmission aperture 30. As a result, the input RF signal 38 is resonated by the interior resonator cavity 34 to generate the filtered RF signal 44, which is output to the output transmission line 40 through the output signal transmission aperture 32 as part of output RF signal 42.

The filtered RF signal 44 is tied to the dimensions of the interior resonator cavity 34, which determines which frequencies of the input RF signal 38 are resonated by the interior resonator cavity 34. In this regard, the dimensions of interior resonator cavity 34 may be customized, or "tuned," to resonate RF frequencies within a predetermined frequency band. For example, in the aspect of FIGS. 1A-1C, the interior resonator cavity 34 has a substantially rectangular cross-section in a plane parallel to the aperture layer 26, and is dimensioned to correspond to a predetermined RF frequency band. In this aspect, for example, the predetermined RF frequency band has a center frequency of sixty (60) GigaHertz (GHz) by having a width dimension corresponding to ½ of a fundamental mode of the center frequency (i.e., 60 GHz) of the predetermined frequency band. In this manner, the interior resonator cavity 34 is configured to resonate frequencies of the input RF signal 38 in the predetermined frequency band to generate the filtered RF signal 44.

Figure 2:
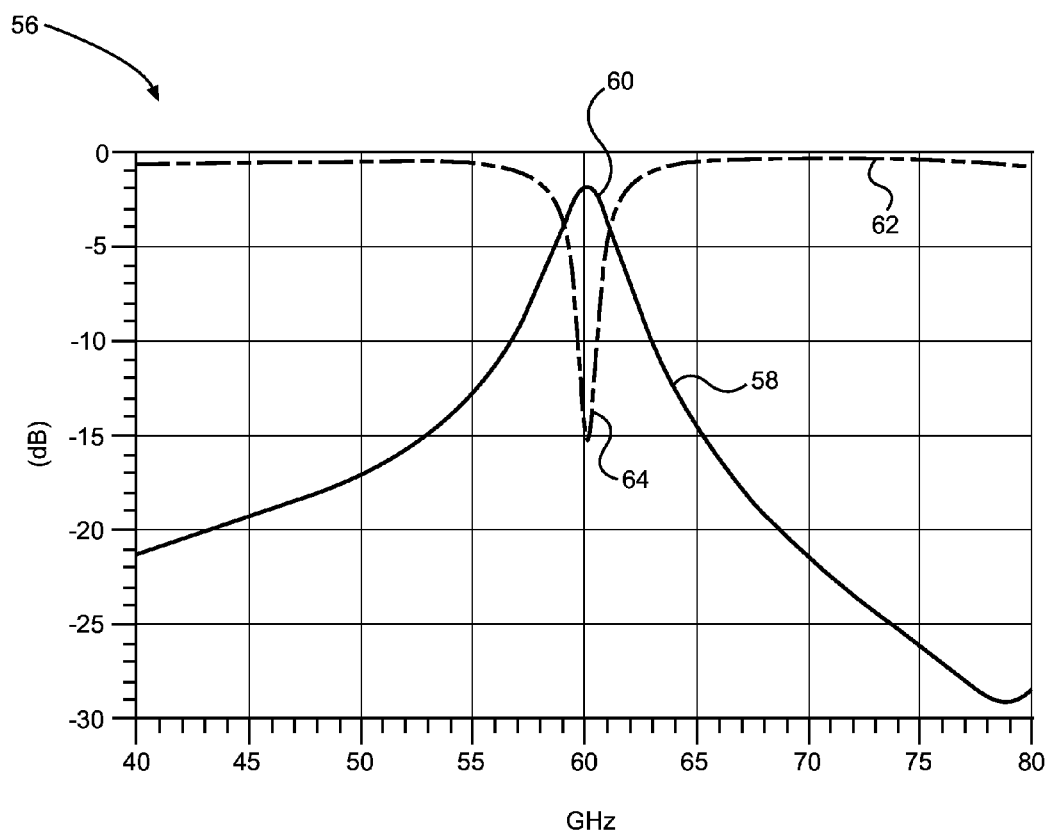
FIG. 2 is a graph illustrating an exemplary frequency response for the flip-chip IC having the integrated cavity filter of FIGS. 1A-1C, tuned to pass radio frequency (RF) signals in a sixty (60) GigaHertz (GHz) band.

In this regard, FIG. 2 illustrates a graph 56 showing frequency response for the integrated cavity filter 12 according to FIGS. 1A-1C, tuned to pass RF signals in the 60 GHz band. As shown by graph 56, a plot 58 of insertion loss for the filtered RF signal 44 (not shown) with respect to the input RF signal 38 shows that the frequencies outside the 60 GHz band are significantly attenuated by the interior resonator cavity 34 (not shown), while frequencies around the 60 GHz center frequency 60 are minimally attenuated, with insertion loss at 60 GHz being approximately 1.86 decibels (dB) in this example. In addition, a plot 62 of return loss shows that the return loss around the 60 GHz center frequency 64, approximately 15.4 dB. In this example, the 3 dB bandwidth for the integrated cavity filter 12 approximately 2.62 dB. In this regard, the interior resonator cavity 34 results in the integrated cavity filter 12 having low insertion loss and return loss, with little or no increase in size for the flip-chip assembly 20 (not shown).

Figure 3A:
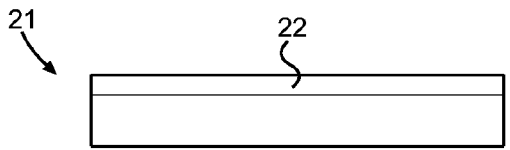
FIGS. 3A-3D illustrate exemplary fabrication stages for fabricating the flip-chip IC of FIGS. 1A-1C.
Figure 3B:
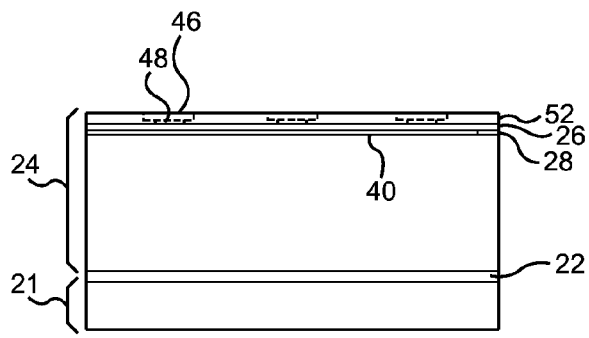
Figure 3C:
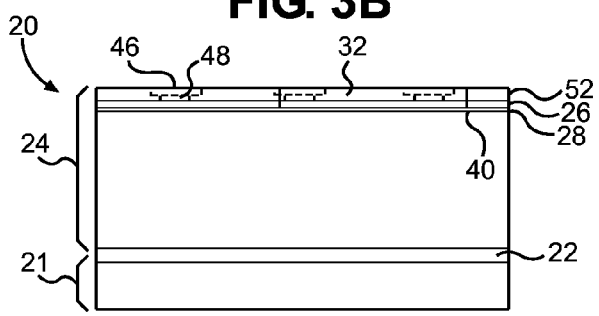
Figure 3D:
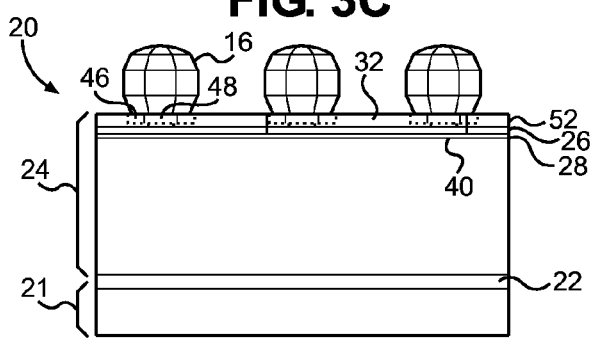
Figure 4:
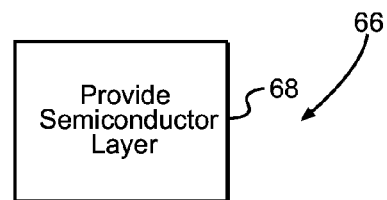
FIG. 4 is a flowchart describing exemplary process steps for performing the IC fabrication stages in FIGS. 3A-3D for fabricating the flip-chip IC of FIGS. 1A-1C.

In addition to the size benefits of using a flip-chip IC 10 with an integrated cavity filter 12, fabrication of the flip-chip IC 10 may also be achieved with only minimal changes to existing fabrication processes. In this regard, referring now to FIGS. 3A-3D, exemplary fabrication stages for fabricating the flip-chip IC 10 of FIGS. 1A-1C are illustrated. In this regard as well, FIG. 4 illustrates a flowchart 66 setting out exemplary method steps corresponding to the illustrated process steps of FIGS. 3A-3D. Referring now to FIG. 3A, the semiconductor layer 22 is first provided in the silicon layer 21 or other substrate (block 68 of FIG. 4). Next, as shown by FIG. 3B, the plurality of metal interconnect layers 24 are disposed over the semiconductor layer 22 (block 70 of FIG. 4) according to the design parameters of the flip-chip IC 10. In addition to the interconnects for the flip-chip IC 10 (not shown), this process step includes providing the input transmission line 36 and output transmission line 40 (not shown) in the back end-of-line interconnect layer 28, providing the aperture layer 26 over the back end-of-line interconnect layer 28, and disposing the top layers 46, including the conductive contacts 48 and metal interconnects 50, over the aperture layer 26. Next the input signal transmission aperture 30 (not shown) and the output signal transmission aperture 32 are formed in the aperture layer 26 and top layers 46 (block 72 of FIG. 4) to expose the input transmission line 36 and output transmission line 40 (not shown) at the back end-of-line interconnect layer 28. Finally, as shown in FIG. 3D, the conductive bumps 16 are disposed on the respective metal interconnects 50 (block 74 of FIG. 4). In this matter, the flip-chip IC 10 is now ready to be interconnected with an external circuit, such as external circuit 18.

Figure 5A:
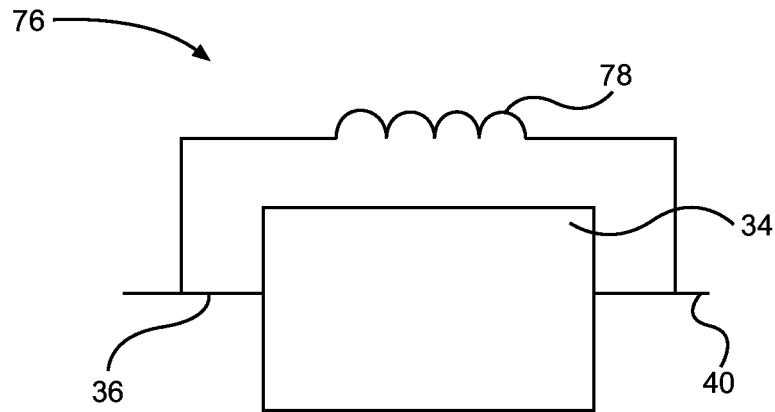
FIG. 5A illustrates a schematic diagram of another exemplary flip-chip IC having an integrated cavity filter that additionally includes an inductance blocker coupled between the input and output transmission lines of the integrated cavity filter.

It may also be advantageous to include additional components, such as inductance and/or capacitance blockers, in the flip-chip arrangement to improve and enhance the functionality of the integrated cavity filter 12. In this regard, FIG. 5A illustrates a schematic diagram of a flip-chip IC 76 having the interior resonator cavity 34 according to the aspect of FIGS. 1A-1C, and also having an inductor 78 interconnected between the input transmission line 36 and output transmission line 40. As shown by the graph 84 of FIG. 5B, the inductor 78 or inductive material operates as an inductance blocker, to increase the rejection of frequencies above the center frequency of the predetermined frequency band. Comparing plot 86, which represents the flip-chip IC 76 without the inductor 78, with plot 88, which represents the flip-chip IC 76 with the inductor 78 included, shows that adding the inductor 78 moves an upper transmission zero 90 of a filtered signal significantly closer to the center frequency, 60 GHz in this example, thereby increasing the filtering quality of the integrated cavity filter 12 of the flip-chip IC 76.

The inductor 78 may be included as a separate component, or may be included as part of the flip-chip IC 76. In this regard, FIG. 5C illustrates a partial side cross-sectional view of the flip-chip IC 76 of FIG. 5A showing the inductor 78 included in one of the metal interconnect layers 24, such as inductor layer 92 of the flip-chip IC 76. The inductor 78 is interconnected with the input transmission line 36 and output transmission line 40 via interconnects 94. The interconnects 94 are disposed in intervening interconnection layers 96 disposed between the inductor layer 92 and the back end-of-line interconnect layer 28. It should be understood, however, that inductance may be provided in other ways as well, such as by an inductive component connected to the input transmission line 36 and output transmission line 40 via the external circuit 18, for example.

In another aspect, a capacitance blocker may also be used to improve the performance of the integrated cavity filter. In this regard, FIG. 6A illustrates an alternative flip-chip IC 98 having a capacitor 100 disposed between the input transmission line 36 and output transmission line 40. Similar to the aspect of FIGS. 5A-5C, the capacitor 100 acts to attenuate frequencies closer to the center frequency, 60 GHz, in this example. Here, however, the capacitor 100 attenuates frequencies below the center frequency, as shown by graph 106 of FIG. 6B. Here, graph 106 illustrates a plot 108 corresponding to the flip-chip IC 98 without the capacitor 100 interconnecting the input transmission line 36 and output transmission line 40, and plot 110 representing the flip-chip IC 98 with the capacitor 100 included. As can be seen by FIG. 6B, the capacitor 100 causes a lower transmission zero 112 to be significantly closer to the center frequency of the desired frequency band, thereby improving performance of the integrated cavity filter 12.

Figure 5B:
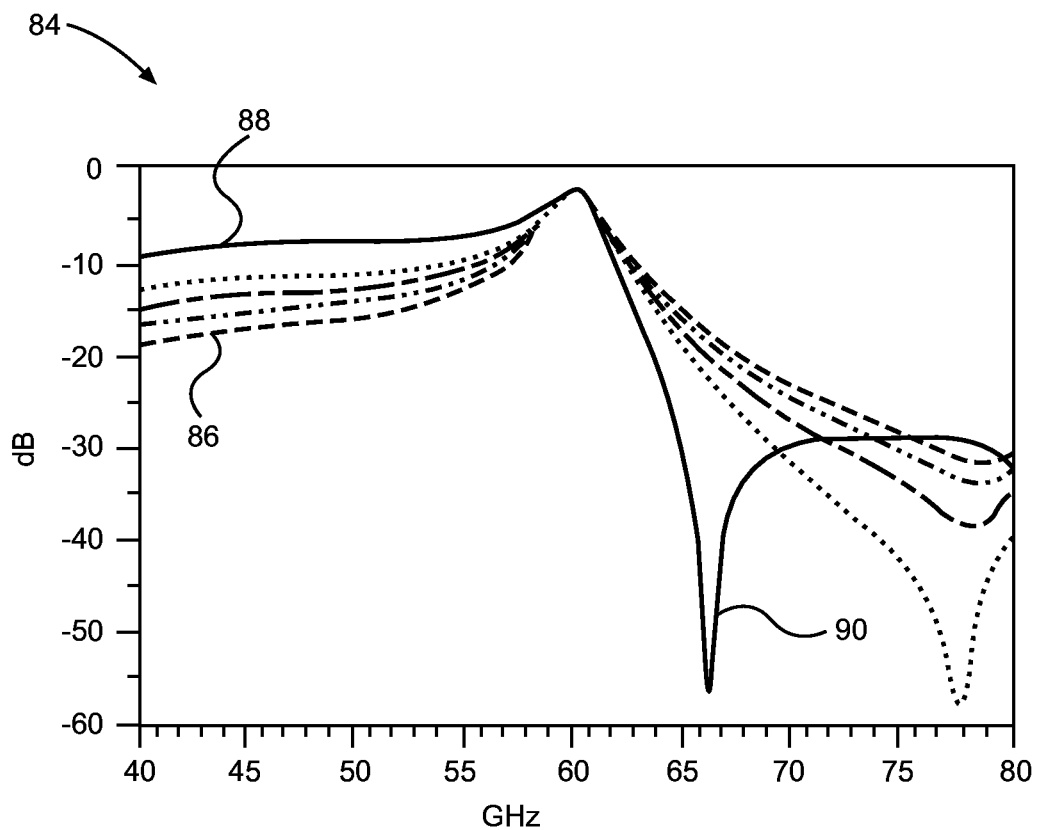
FIG. 5B is a graph of an exemplary frequency response of the flip-chip IC of FIG. 5A having the integrated cavity filter with the inductance blocker of FIG. 5A.
Figure 5C:
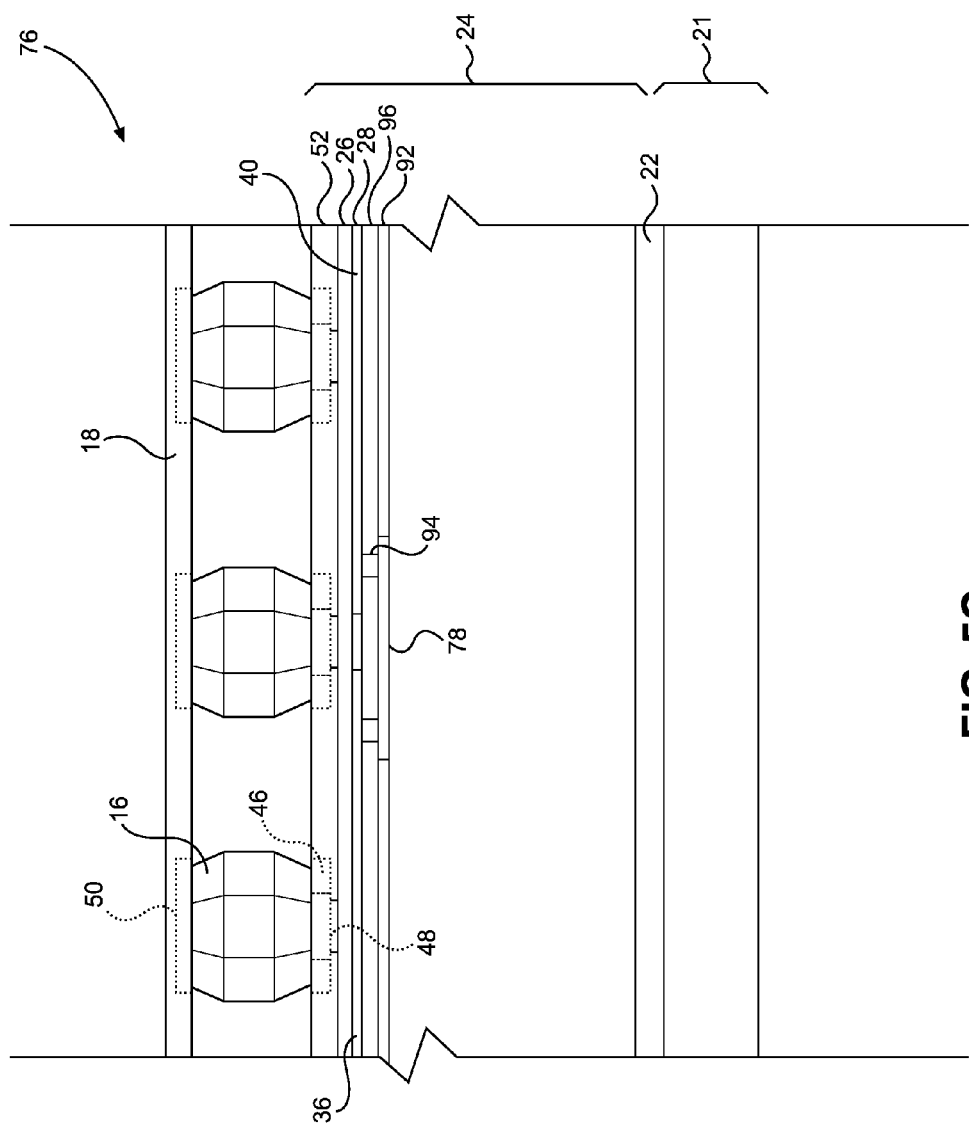
FIG. 5C illustrates a partial side cross-sectional view of the flip-chip IC of FIG. 5A having the integrated cavity filter with the inductance blocker of FIG. 5A.
Figure 6A:
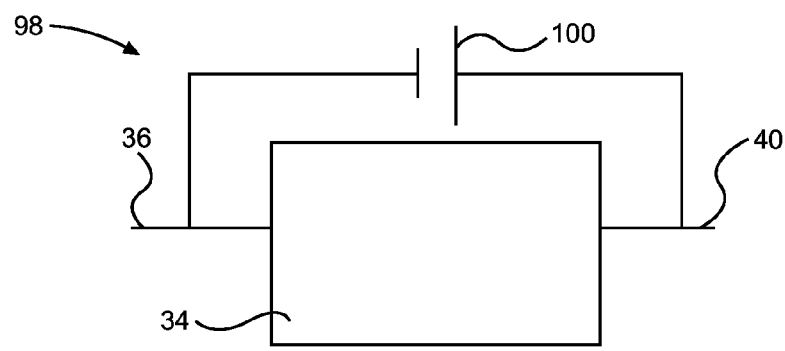
FIG. 6A illustrate a schematic diagram of another exemplary IC flip-chip having an integrated cavity filter that additionally includes a capacitance blocker coupled between the input and output transmission lines of the integrated cavity filter.
Figure 6B:
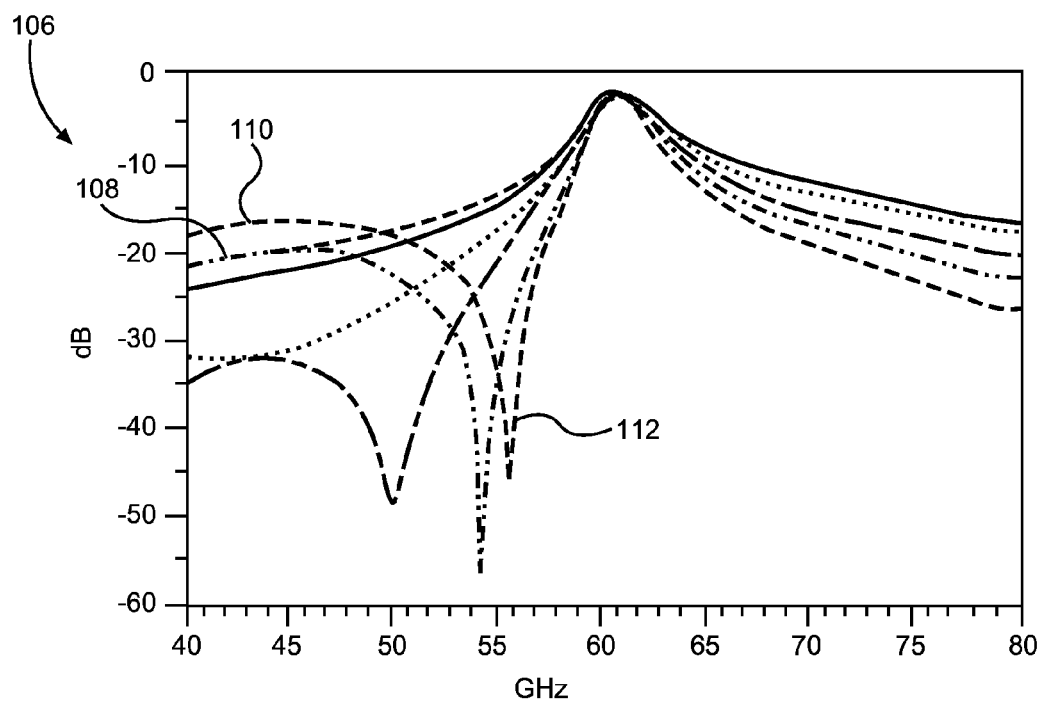
FIG. 6B is a graph of an exemplary frequency response for the IC flip-chip of FIG. 6A having the integrated cavity filter with the capacitance blocker of FIG. 6A.

As with the inductor 78 of FIGS. 5A-5C, the capacitor 100 of FIG. 6A may also be included as a separate component, or may be included as part of the flip-chip IC 98. In this regard, FIG. 6C illustrates the capacitor 100 included in one of the metal interconnect layers 24 of the flip-chip IC 98, such as capacitor layer 101, similar to the inductor 78 of FIG. 5C. In FIG. 6C, the capacitor 100 is interconnected with the input transmission line 36 and output transmission line 40 via interconnects 94. The interconnects 94 are disposed in intervening interconnection layers 96 disposed between the capacitor layer 101 and the back end-of-line interconnect layer 28. It should be understood, however, that capacitance may be provided in other ways as well, such as by a capacitive component connected to the input transmission line 36 and output transmission line 40 via the external circuit 18 for example.

Figure 7A:
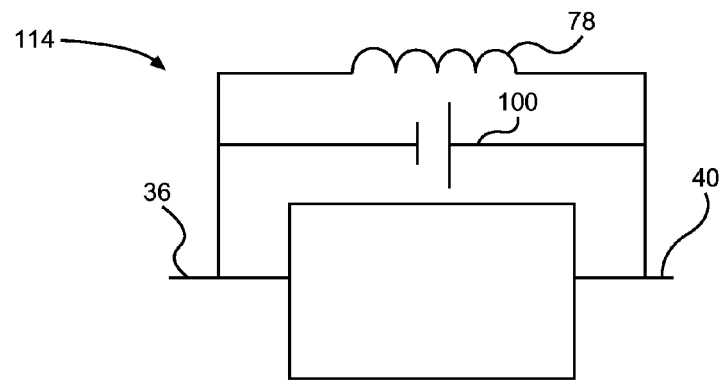
FIG. 7A illustrates a schematic diagram of another exemplary IC flip-chip having an integrated cavity filter that additionally includes an inductance blocker and a capacitance blocker coupled between the input and output transmission lines of the integrated cavity filter.
Figure 7B:
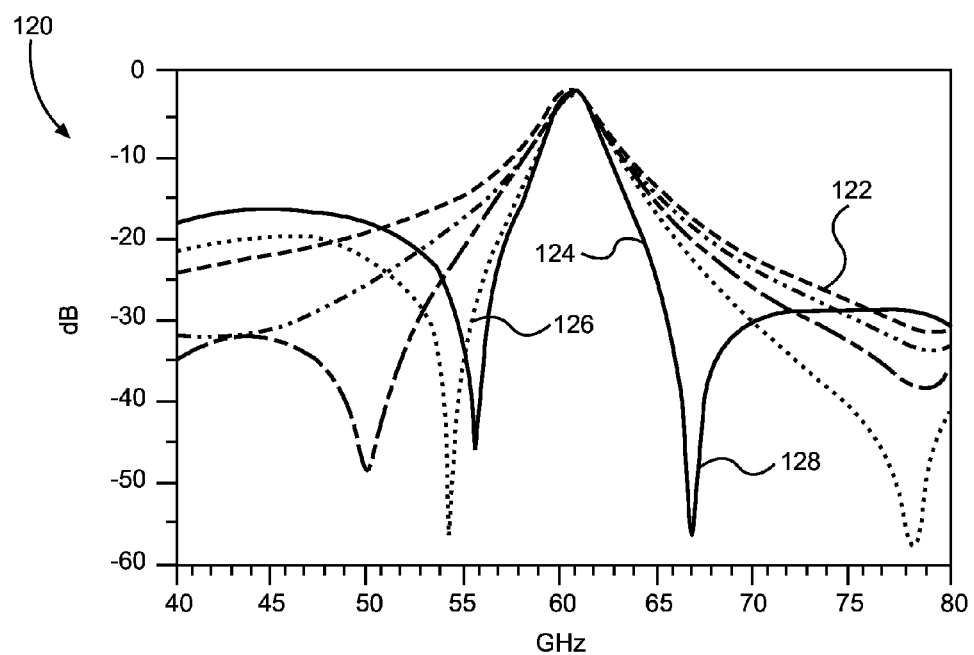
FIG. 7B illustrates a frequency response graph for the flip-chip of FIG. 7A having a cavity filter with the inductance and capacitance blockers of FIG. 7A.

The aspects of FIGS. 5A-5C and 6A-6C may also be combined to include an inductance blocker and capacitance blocker connected in parallel to better attenuate frequencies on either side of the frequency band. In this regard, FIG. 7A illustrates an alternative flip-chip IC 114 having both the inductor 78 and the capacitor 100 connected in parallel between the input transmission line 36 and output transmission line 40. As shown by graph 120 in FIG. 7B, comparing the plot 122, which represents the flip-chip IC 114 without the inductor 78 or capacitor 100 included, plot 124, which represents the flip-chip IC 114 with both the inductor 78 and capacitor 100 connected in parallel between the input transmission line 36 and output transmission line 40, shows that frequencies nearer to the center frequencies are attenuated to a greater degree. Here, the lower transmission zero 126 below the center frequency and the upper transmission zero 128 above the center frequency are both nearer to the center frequency of the desired frequency band than using the interior resonator cavity 34 alone.

The aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 8:
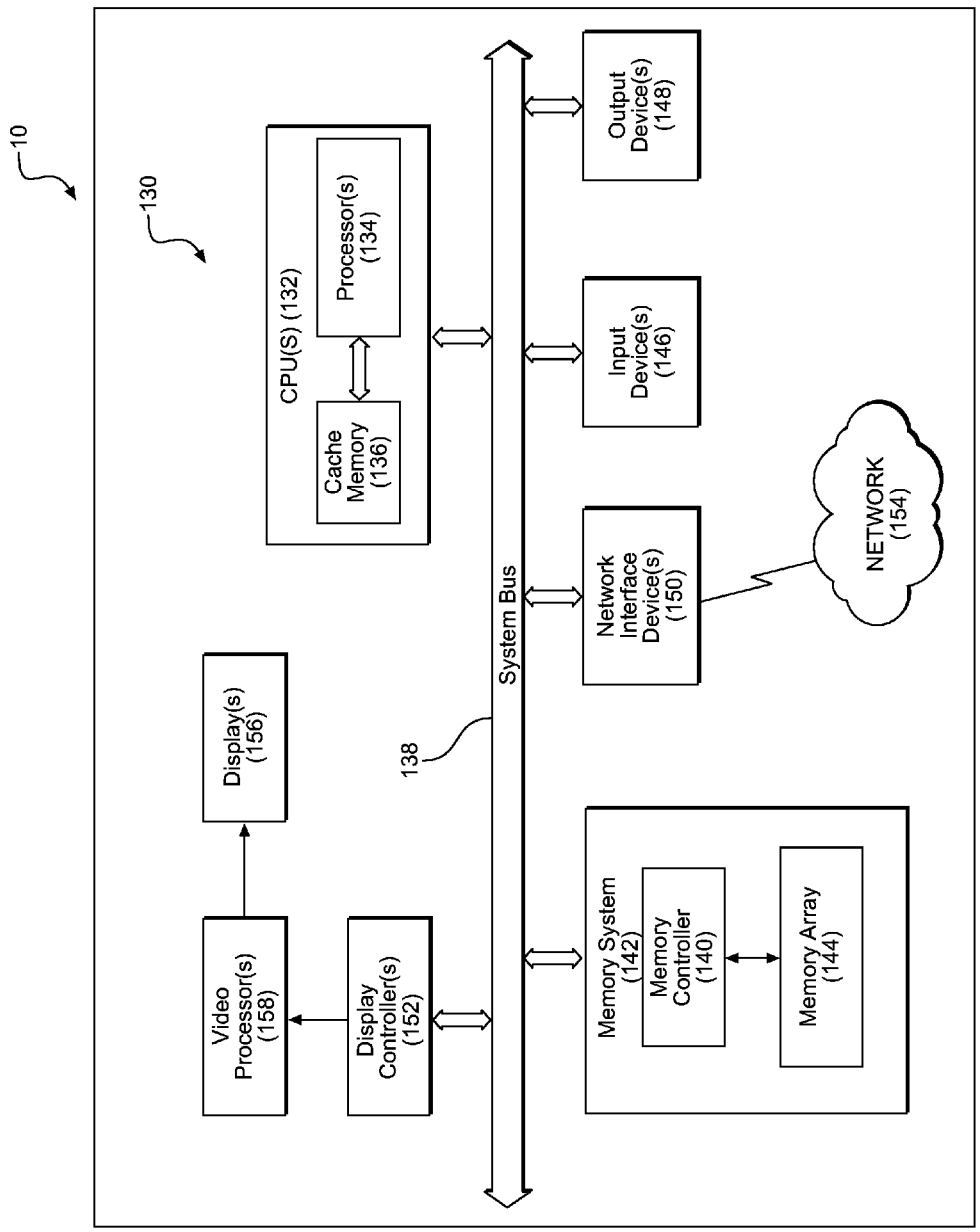
FIG. 8 is a block diagram of an exemplary processor-based system-on-a-chip (SOC) that can be contained in the flip-chip IC with an integrated cavity filter according to any of the aspects disclosed herein.

In this regard, FIG. 8 is a block diagram of an exemplary processor-based system-on-a-chip (SoC) that can be contained in the flip-chip IC 10 with an integrated cavity filter according to any of the aspects disclosed herein. As used herein, the term "system-on-a-chip (SoC)" refers to a plurality of functional elements contained on a single chip, such as the flip-chip IC 10, the plurality of functional elements being configured to interoperate in a self-contained manner. In this example, the processor-based system 130 includes one or more central processing units (CPUs) 132, each including one or more processors 134. The CPU(s) 132 may have cache memory 136 coupled to the processor(s) 134 for rapid access to temporarily stored data. The CPU(s) 132 is coupled to a system bus 138 and can intercouple master and slave devices included in the processor-based system 130. As is well known, the CPU(s) 132 communicates with these other devices by exchanging address, control, and data information over the system bus 138. For example, the CPU(s) 132 can communicate bus transaction requests to a memory controller 140 in a memory system 142 as an example of a slave device. Although not illustrated in FIG. 8, multiple system buses 138 could be provided, wherein each system bus 138 constitutes a different fabric. In this example, the memory controller 140 is configured to provide memory access requests to a memory array 144 in the memory system 142.

Other devices can be connected to the system bus 138. As illustrated in FIG. 8, these devices can include the memory system 142, one or more input devices 146, one or more output devices 148, one or more network interface devices 150, and one or more display controllers 152, as examples. The input device(s) 146 can include any type of input device, including but not limited to input keys, switches, voice processors, etc. The output device(s) 148 can include any type of output device, including but not limited to audio, video, other visual indicators, etc. The network interface device(s) 150 can be any devices configured to allow exchange of data to and from a network 154. The network 154 can be any type of network, including but not limited to a wired or wireless network, a private or public network, a local area network (LAN), a wide local area network (WLAN), and the Internet. The network interface device(s) 150 can be configured to support any type of communications protocol desired.

The CPU(s) 132 may also be configured to access the display controller(s) 152 over the system bus 138 to control information sent to one or more displays 156. The display controller(s) 152 sends information to the display(s) 156 to be displayed via one or more video processors 158, which process the information to be displayed into a format suitable for the display(s) 156. The display(s) 156 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or flip-chip IC, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A flip-chip integrated circuit (IC) comprising:
    a semiconductor die, comprising:
        at least one semiconductor layer;
        a plurality of metal layers for providing interconnections to the at least one semiconductor layer;
        an aperture layer comprising an input signal transmission aperture configured to pass an input radio-frequency (RF) signal therethrough, and an output signal transmission aperture configured to pass an output RF signal therethrough; and
        at least one back end-of-line interconnect layer disposed between the at least one semiconductor layer and the aperture layer, the at least one back end-of-line interconnect layer, comprising:
            an input transmission line configured to transmit the input RF signal through the input signal transmission aperture; and
            an output transmission line configured to receive the output RF signal through the output signal transmission aperture; and
    a plurality of conductive bumps interconnected to at least one metal layer, the plurality of conductive bumps and the aperture layer defining an interior resonator cavity;
    the interior resonator cavity configured to receive the input RF signal from the input transmission line through the input signal transmission aperture, resonate the input RF signal to generate the output RF signal comprising a filtered RF signal of the input RF signal, and couple the output RF signal on the output transmission line through the output signal transmission aperture.

2. The flip-chip IC of claim 1, wherein the interior resonator cavity is dimensioned to correspond to a predetermined RF frequency band, such that the interior resonator cavity is configured to resonate frequencies of the input RF signal in the predetermined RF frequency band to generate the filtered RF signal.

3. The flip-chip IC of claim 2, wherein the predetermined RF frequency band has a center frequency of sixty (60) GigaHertz (GHz).

4. The flip-chip IC of claim 2, wherein the interior resonator cavity has a substantially rectangular cross-section in a plane parallel to the aperture layer.

5. The flip-chip IC of claim 4, wherein the substantially rectangular cross-section has a width dimension corresponding to ½ of a fundamental mode of a center frequency of the predetermined RF frequency band.

6. The flip-chip IC of claim 1, wherein the plurality of conductive bumps are comprised of a plurality of solder balls.

7. The flip-chip IC of claim 1, wherein the plurality of conductive bumps are configured to interconnect with complementary contacts of an external circuit such that the aperture layer, the plurality of conductive bumps, and at least a portion of the external circuit define a faraday cage around the interior resonator cavity.

8. The flip-chip IC of claim 1, wherein the output transmission line interconnects with the plurality of metal layers.

9. The flip-chip IC of claim 8, wherein the output transmission line interconnects with at least one of the plurality of conductive bumps via the plurality of metal layers.

10. The flip-chip IC of claim 8, wherein the input transmission line interconnects with the plurality of metal layers.

11. The flip-chip IC of claim 10, wherein the input transmission line interconnects with at least one of the plurality of conductive bumps via the plurality of metal layers.

12. The flip-chip IC of claim 11, wherein the output transmission line interconnects with at least one of the plurality of conductive bumps via the plurality of metal layers.

13. The flip-chip IC of claim 1, wherein the aperture layer defines an external surface of the semiconductor die, wherein the input and output signal transmission apertures are formed in the external surface of the semiconductor die.

14. The flip-chip IC of claim 1, wherein the at least one back end-of-line interconnect layer is adjacent to the aperture layer,
    at least a portion of the input transmission line is adjacent the input signal transmission aperture, and
    at least a portion of the output transmission line is adjacent the output signal transmission aperture.

15. The flip-chip IC of claim 1, further comprising an inductance blocker comprising at least one inductor interconnected between the input transmission line and the output transmission line.

16. The flip-chip IC of claim 15, wherein the at least one inductor is disposed in at least one of the plurality of metal layers of the semiconductor die.

17. The flip-chip IC of claim 15, further comprising a capacitance blocker comprising at least one capacitor interconnected between the input transmission line and the output transmission line in parallel with the inductor.

18. The flip-chip IC of claim 1, further comprising a capacitance blocker comprising at least one capacitor interconnected between the input transmission line and the output transmission line.

19. The flip-chip IC of claim 18, wherein the at least one capacitor is disposed in at least one of the plurality of metal layers of the semiconductor die.

20. The flip-chip IC of claim 1, wherein the semiconductor die comprises system-on-a-chip (SoC) having a plurality of functional elements configured to interoperate in a self-contained manner.

21. The flip-chip IC of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

22. A flip-chip integrated circuit (IC) comprising:
  a means for providing at least one semiconductor layer in a semiconductor die;
  a means for providing a plurality of metal layers for providing interconnections to the means for providing a semiconductor layer;
  a means for providing an aperture layer comprising an input signal transmission aperture configured to pass an input radio-frequency (RF) signal therethrough, and an output signal transmission aperture configured to pass an output RF signal therethrough; and
  a means for providing at least one back end-of-line interconnect layer disposed between the at least one semiconductor layer and the aperture layer, the at least one back end-of-line interconnect layer, comprising:
    an input transmission line configured to transmit an input RF signal through the input signal transmission aperture; and
    an output transmission line configured to receive the output RF signal through the output signal transmission aperture; and
  a means for providing a plurality of conductive connections interconnected to at least one metal layer,
  a means for providing an interior resonator cavity from the means for providing the plurality of conductive connections and the means for providing an aperture layer, for providing the interior resonator cavity for receiving the input RF signal from the input transmission line through the input signal transmission aperture, resonating the input RF signal to generate the output RF signal comprising a filtered RF signal of the input RF signal, and coupling the output RF signal on the output transmission line through the output signal transmission aperture.

23. A method of forming an integrated circuit (IC) chip, the method comprising:
  providing at least one semiconductor layer;
  disposing a plurality of metal layers above the at least one semiconductor layer for providing interconnections to the at least one semiconductor layer;
  disposing at least one back end-of-line interconnect layer above the plurality of metal layers, the at least one back end-of-line interconnect layer comprising:
    an input transmission line configured to transmit an input radio frequency (RF) signal; and
    an output transmission line configured to receive an output RF signal;
  disposing an aperture layer above the at least one back end-of-line interconnect layer, the aperture layer comprising an input signal transmission aperture configured to pass the input RF signal therethrough, and an output signal transmission aperture configured to pass the output RF signal therethrough; and
  disposing a plurality of conductive bumps above the aperture layer, the plurality of conductive bumps interconnected to at least one metal layer, the plurality of conductive bumps and the aperture layer defining an interior resonator cavity;
  the interior resonator cavity configured to receive the input RF signal from the input transmission line through the input signal transmission aperture, resonate the input RF signal to generate the output RF signal comprising a filtered RF signal of the input RF signal, and couple the output RF signal on the output transmission line through the output signal transmission aperture.

24. The method of claim 23, further comprising:
  interconnecting the plurality of conductive bumps with an external circuit, such that the aperture layer, the plurality of conductive bumps, and at least a portion of the external circuit define a faraday cage around the interior resonator cavity.

25. The method of claim 23, wherein disposing the plurality of metal layers above the at least one semiconductor layer comprises disposing at least one inductor in the plurality of metal layers, such that disposing at least one back end-of-line interconnect layer above the plurality of metal layers interconnects the at least one inductor between the input transmission line and the output transmission line.

26. The method of claim 25, wherein disposing the plurality of metal layers above the at least one semiconductor layer further comprises disposing at least one capacitor in the plurality of metal layers, such that disposing at least one back end-of-line interconnect layer above the plurality of metal layers interconnects the at least one inductor and the at least one capacitor in parallel between the input transmission line and the output transmission line.

27. The method of claim 23, wherein disposing the plurality of metal layers above the at least one semiconductor layer further comprises disposing at least one capacitor in the plurality of metal layers, such that disposing at least one back end-of-line interconnect layer above the plurality of metal layers interconnects the at least one capacitor between the input transmission line and the output transmission line.

28. A circuit board having an integrated cavity filter, the circuit board comprising:
  an integrated circuit (IC) chip comprising:
    a semiconductor die, comprising:
      at least one semiconductor layer;
      a plurality of metal layers for providing interconnections to the at least one semiconductor layer;
      an aperture layer comprising an input signal transmission aperture configured to pass an input radio frequency (RF) signal therethrough, and an output signal transmission aperture configured to pass an output RF signal therethrough; and
      at least one back end-of-line interconnect layer disposed between the at least one semiconductor layer and the aperture layer, the at least one back end-of-line interconnect layer comprising:
        an input transmission line configured to transmit an input RF signal through the input signal transmission aperture; and
        an output transmission line configured to receive the output RF signal through the output signal transmission aperture; and
    a plurality of conductive bumps interconnected to at least one metal layer,
    the plurality of conductive bumps and the aperture layer defining an interior resonator cavity configured to receive the input RF signal from the input transmission line through the input signal transmission aperture, resonate the input RF signal to generate the output RF signal comprising a filtered RF signal of the input RF signal, and couple the output RF signal on the output transmission line through the output signal transmission aperture; and
  an external circuit interconnected to the plurality of conductive bumps, wherein the external circuit, the plurality of conductive bumps, and at least a portion of the external circuit define a faraday cage around the interior resonator cavity.

29. The circuit board of claim 28, wherein the interior resonator cavity is dimensioned to correspond to a predetermined RF frequency band, such that the interior resonator cavity is configured to resonate frequencies of the input RF signal in the predetermined RF frequency band to generate the filtered RF signal.

* * * * *

UNITED STATES PATENT AND TRADEMARK OFFICE
CERTIFICATE OF CORRECTION

PATENT NO. : 9,443,810 B1
APPLICATION NO. : 14/853802
DATED : September 13, 2016
INVENTOR(S) : John Jong-Hoon Lee et al.

Page 1 of 1

It is certified that error appears in the above-identified patent and that said Letters Patent is hereby corrected as shown below:

IN THE SPECIFICATION
Column 6, line 51, change the text to read "nal circuit 18, the interior resonator cavity 34 is --fully-- enclosed."

Signed and Sealed this
Eighth Day of November, 2016

Michelle K. Lee
*Director of the United States Patent and Trademark Office*